United States Patent [19]

Carr et al.

[11] Patent Number: 4,745,363
[45] Date of Patent: May 17, 1988

[54] NON-ORIENTED DIRECT COUPLED GEAR TOOTH SENSOR USING A HALL CELL

[75] Inventors: Ronald E. Carr, Plantation; Matthew L. Schneider, Margate; Paul E. Payne, Ft. Lauderdale, all of Fla.

[73] Assignee: North American Philips Corporation, New York, N.Y.

[21] Appl. No.: 934,873

[22] Filed: Nov. 25, 1986

Related U.S. Application Data

[63] Continuation-in-part of Ser. No. 886,592, Jul. 16, 1986.

[51] Int. Cl.⁴ .............................. G01B 7/30; G01P 3/4; G01R 33/06
[52] U.S. Cl. .................................... 324/208; 324/174; 324/235; 324/251
[58] Field of Search ............... 324/173, 174, 207, 208, 324/235, 251; 338/32 H; 307/309; 246/247, 249; 73/DIG. 3

[56] References Cited

U.S. PATENT DOCUMENTS

| | | |
|---|---|---|
| 3,579,099 | 5/1971 | Kanbayashi .......................... 324/235 |
| 3,885,212 | 5/1975 | Herbert ........................... 324/251 X |
| 4,086,533 | 4/1978 | Ricouard et al. .................... 324/208 |
| 4,207,519 | 6/1980 | Zatsepin et al. ..................... 324/235 |
| 4,293,814 | 10/1981 | Boyer ............................. 324/173 X |
| 4,481,469 | 11/1984 | Hauler et al. ........................ 324/174 |
| 4,518,918 | 5/1985 | Avery ................................. 324/208 |
| 4,524,932 | 6/1985 | Bodziak .......................... 324/207 X |
| 4,587,509 | 5/1986 | Pitt et al. ......................... 324/260 X |

Primary Examiner—Gerard R. Strecker
Attorney, Agent, or Firm—James J. Cannon; F. Brice Faller

[57] ABSTRACT

A non-oriented direct coupled sensor for gear teeth or similarly shaped discontinuities of a ferrous magnetic or magnetic target uses a single magnet and a direct coupled Hall cell integrated circuit to detect the presence or absence of gear teeth. The sensor incorporates techniques for flux steering and flux reversals independent of the orientation of the sensor to the target to overcome the operate or release point of a Hall switch, latch or other device. The use of spaced apart, offset flux concentrators provides a sensitive device with favorable tolerances in temperature and air gap.

11 Claims, 2 Drawing Sheets

NON-ORIENTED DIRECT COUPLED GEAR TOOTH SENSOR USING A HALL CELL

CROSS-REFERENCE TO RELATED APPLICATION

This application is a continuation-in-part of pending U.S. patent application, Ser. No. 886,592, filed July 16, 1986, entitled DIRECT COUPLED GEAR TOOTH SENSOR USING A HALL CELL, Paul E. Payne and Mathew Schneider, inventors, which is incorporated herein by reference.

BACKGROUND OF THE INVENTION

1. Field of the Invention

The present invention pertains to active sensor devices such as motion, edge, frequency and speed sensors or counting devices. In particular, it relates to gear tooth sensors which sense the presence or absence of gear teeth as they rotate past a sensor device, and especially the invention relates to such sensors which use a magnet and a Hall cell integrated circuit and which do not require a specific orientation between the sensor and the gear.

2. Description of the Prior Art

Prior art approaches to gear tooth sensors have included magneto-resistive devices, a proximity switch and other similar devices. The problems with the previous devices have been cost, temperature range, manufacturing tolerances and air gaps.

As a preliminary note, the basic Hall sensor is simply a small sheet of semiconductor material. A constant voltage source forces a constant bias current to flow in the longitudinal direction in the semiconductor sheet. The output, a voltage measured across the width of the sheet, reads near zero if a magnetic field is not present. If the biased Hall sensor is placed in a magnetic field oriented transversely to the Hall current, the voltage output is in direct proportion to the strength of the magnetic flux component at right angles to the hall cell. The basic Hall sensor is essentially a transducer that will respond with an output voltage if the applied magnetic field changes in any manner.

Principles of operation are discussed in the "Sprague Integrated Circuits Data Book", WR-503, in Section 9, published by Sprague Electric Company, North Adams, Mass. Hall cells can be operated by a unidirectional field where the parameter B (flux density) expressed in Gauss can be modulated to produce a level of flux either below or above a threshold level which is established by either a bias flux level or by an electronic bias in the circuit reading the Hall cell. This type of component is termed a Hall digital switch, and is typified by Sprague UGN 3040T described on page 9–11 of the above-cited Sprague Data Book.

Hall cells can also be operated by a bidirectional field wherein the parameter B (flux density) expressed in Gauss can be alternated in polarity to produce flux passing through the cell first in one direction and then in the other direction. This type of component is termed a Hall digital latch and is typified by UGN 3075T on page 9–15 of the above-cited Sprague Data Book.

The Sprague Data Book also illustrates a technique for detecting what could be termed "gear teeth", but this technique has the disadvantage that the electronics are A-C coupled and therefore cannot be used where direct coupling is required.

Many attempts to make a gear tooth sensor which is direct coupled and which uses one or two stationary magnets to produce flux have been made. Such attempts usually consist of techniques employing the previously mentioned digital switch type components in one form or another wherein a passing gear tooth modulates the magnitude of flux about a fixed bias B. These techniques are very susceptible to changes in temperature and changes in the distance between the gear tooth and the sensor, commonly known as the air gap.

The prior art does not show a method or device for bending or steering the flux paths using a single magnet with a gear to cause a Hall switch or latch to change levels as the gear passes. The prior art used a vane for flux shunting or moving magnets. For example, most automotive ignition systems interrupt a magnetic field with a vane.

The cross-reference application discloses a technique using direct coupled Hall devices for sensing gear teeth or other discontinuities of iron or similar ferrous magnetic or magnetic targets in commercially feasible embodiments which can be constructed using presently available electronic components.

SUMMARY OF THE INVENTION

The present invention pertains to a non-oriented gear tooth sensor which uses a single magnet and a Hall cell integrated circuit to sense the presence or absence of gear teeth as they rotate past the sensor. In a typical magnetic sensor, the sensor and the gear being sensed must have some specific orientation relative to each other such that a passing gear can modulate the flux field to produce a level of flux above or below a threshold, or such that a passing gear can alternate the polarity of the flux field, either of which can be detected and interpreted. The need for relative orientation is overcome by incorporating the concept of flux steering, that is bending the flux paths. A single magnet is used with a gear to cause a Hall switch or latch to change levels as the gear passes.

In the preferred embodiment of the present invention the Hall cell is centered on one polar end of the permanent magnet. Two flux steering concentrators, which are extensions of soft iron, are appended to the same polar end of the magnet in an opposed, off-center arrangement such that one edge of each flux concentrator is aligned with the center of the Hall device which is positioned between them. Each of the flux concentrators extends outward from the center line of the Hall cell circuit in opposed directions, forming a stepped arrangement. Additionally, the height of the flux concentrators above the polar surface of the magnet may be the same as that of the Hall cell package, such that the top surfaces of the Hall cell package and the flux concentrators are flush. In this embodiment, one-half the planar surface of one side of the Hall cell package is parallel to at least part of the interior planar surface of one flux concentrator and the other half of the other planar surface of the Hall cell package is parallel with at least part of the interior planar surface of the other flux concentrator. By placing one edge of each flux concentrator at the center of the Hall cell in the stepped arrangement, the Hall cell will operate independently of its relative orientation towards the gear because the concentrators are more effective in directing and concentrating more of the flux through the area of the Hall cell itself than other embodiments. This concentration of flux through the Hall cell improves the sensitivity of the sensor. A further advantage is that a greater air gap is possible in many applications and with some sizes of gears. In certain applications, the air gap can be optimized when the top surfaces of the flux guides are flush with the top edges of the Hall cell package.

Utilizing the Hall effect technology a reasonably accurate device over a wide temperature range can be realized. The devices will be very accurate over a wide temperature range and they will sense a gear tooth without the gear tooth itself being a magnet.

BRIEF DESRIPTION OF THE DRAWINGS

DESCRIPTION OF THE PREFERRED EMBODIMENTS

Figure 1:
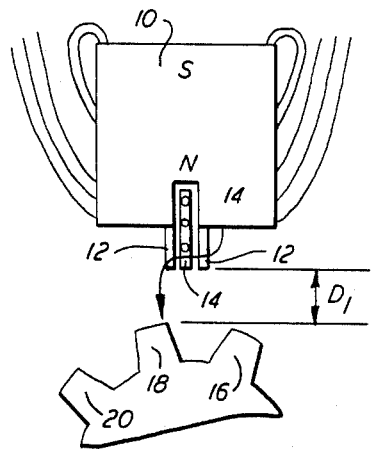
FIGS. 1, 2 and 3 are diagrammatic views of the preferred embodiment of the gear tooth sensor of the cross-referenced invention, showing a gear approaching the sensor in FIG. 1, the gear centered under the sensor in FIG. 2, and the gear leaving the sensor in FIG. 3.
Figure 2:
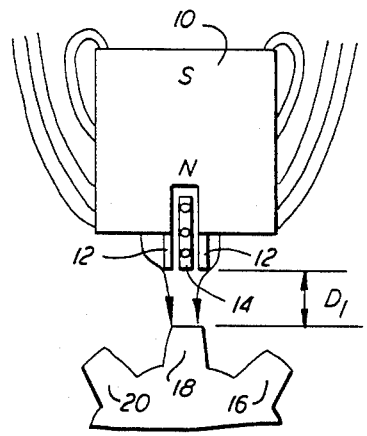
Figure 3:
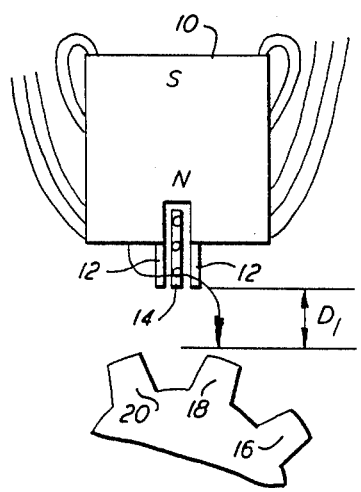

FIGS. 1, 2 and 3 illustrate a permanent magnet 10 having joined thereto two spaced apart soft iron protrusions on one polar end, these protrusions serving as flux steering parts or flux concentrators 12. A Hall cell integrated circuit 14 which can have as a part thereof either a digital latch or a digital switch is positioned between said flux concentrators 12, the plane of said Hall cell being substantially parallel to the interior planar sides of flux concentrators 12.

The integrated circuit 14 is recessed in the planar surface of magnet 10 because the Hall cell itself is only a small portion of the integrated circuit package. For the invention to operate optimally, the Hall cell itself should be as close as possible to the planar surface of one polar end of magnet 10. Flux lines represent only the path and direction of the flux through concentrators 12; they do not indicate the intensity or strength of the flux. As great teeth rotate past the Hall cell in circuit 14, the flux perpendicular to the face or plane of the Hall cell is zero when a tooth is directly balanced below the Hall cell and the flux concentrators 12. As a given tooth is displaced to one side or the other, the flux is steered through one of the concentrators 12 to produce a component perpendicular to the Hall cell, causing a complete flux reversal with each passing gear tooth. This is illustrated in FIGS. 1, 2 and 3, in which a gear having teeth 16, 18 and 20 is shown rotating in a clockwise direction. As gear tooth 16 is departing from the flux around magnet 10, the flux lines thereto become weaker while the leading edge of gear tooth 18 is entering the field just below flux concentrators 12 and Hall cell in circuit 14. The effect is that some of the flux lines from the right hand concentrator 12 will be steered perpendicular to the Hall cell and downward to the leading edge of gear tooth 18 as shown in FIG. 1. When gear tooth 18 is fully centered under flux concentrators 12 and Hall cell in circuit 14, the normal flux patterns will prevail and there will be no component of the flux perpendicular to Hall cell in circuit 14, as shown in FIG. 2. As the trailing edge of gear tooth 18 moves out of the flux pattern, some flux lines from the left concentrator 12 are steered perpendicular to the Hall cell and then down toward the trailing edge of tooth 18 causing a flux reversal from the flux pattern of FIG. 1, as is illustrated in FIG. 3. In this embodiment the Hall cell could be the model 3050 latch of Sprague. It is the horizontal component of the flux passing through one concentrator to the plane of the Hall cell to an approaching or departing gear tooth which causes the flux reversal. In this embodiment, the concentrators 12 serve to steer the flux to and across the Hall cell. In the balanced condition illustrated in FIG. 2 the flux lines have no component perpendicular to the face of the cell.

In terms of a physical embodiment, a Hall cell integrated circuit, Sprague No. 3050 latch, is placed on the face of a ¼ inch × ⅜ inch × ⅜ inch long Alnico-8 magnet. In this configuration the IC is essentially balanced and can respond sensitively to flux being modulated by the gear teeth. An 8 DP gear can be rotated in front of the assembly with a substantial air gap. The IC will produce an output pulse for each passing gear tooth.

Typical test results indicate that using an 8 pitch gear with 0.020 inches air gap the flux change was approximately 800 Gauss. This is a very significant reversal in flux and sufficient to ensure very reliable operation of the sensor.

Figure 4:
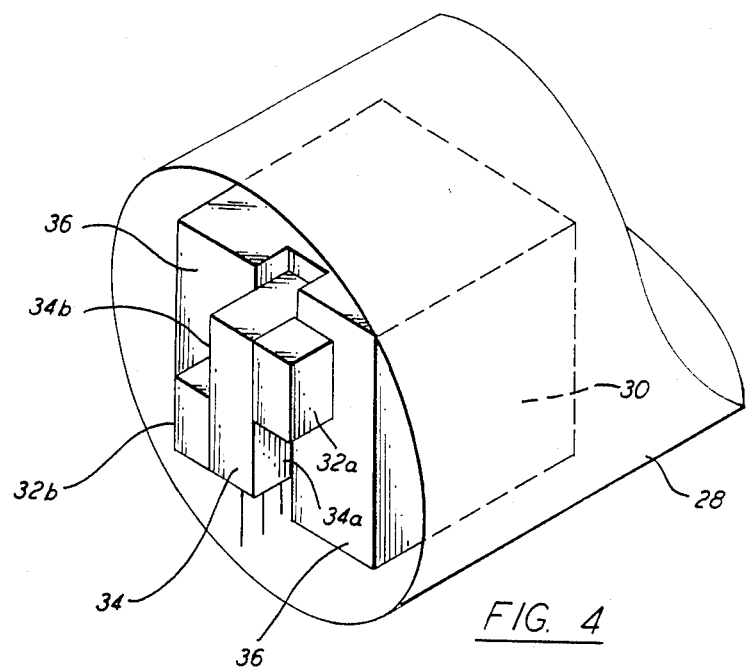
FIG. 4 is a perspective view of the non-oriented direct coupled gear sensor in a cylindrical housing.

FIG. 4 is a perspective view of the non-oriented direct coupled gear sensor 26 in a cylindrical housing 28. When the sensor in its housing is installed in a working environment, there is need to control its orientation vis-a-vis a gear whose teeth it senses. In a typical prior art magnetic sensor, the sensor and the gear being sensed must have some specific orientation relative to each other such that a passing gear can modulate the flux field to produce a level of flux above or below a threshold, or such that a passing gear can alternate the polarity of the flux field, either of which can be detected and interpreted. The sensor 27 includes 30, a Hall cell integrated circuit 34 positioned perpendicular to the planar surface of one polar end of said magnet, and a pair of flux concentrators 32a and 32b. The Hall cell integrated circuit package 34 includes a Hall cell, not shown, and appropriate circuitry to constitute a digital switch or a digital latch, such as Sprague UGN 3040T or UGN 3075T, repsectively. The Hall cell contained in integrated circuit 34 should be perpendicular to the plane of polar surface 36 of permanent magnet 30 and as close to surface 36 as possible. For this reason the Hall cell integrated circuit 34 is recessed slightly into magnet 30.

Flux concentrators 32a and 32b are protrusions of soft iron perpendicular to polar surface 36 and positioned on either side of Hall cell integrated circuit 34 such that an interior planar surface of flux concentrator 32a is against a first half of a first planar surface 34a of integrated circuit 34, while an interior planar surface of flux concentrator 32b is against a second half of a second planar surface 34b of integrated circuit 34. The first and second planar surfaces are on opposed sides of integrated circuit 34 and are offset relative to one another. Flux guides 32a, 32b are substantially even with a perpendicular center line through Hall Cell integrated circuit 34, on opposite sides thereof. The flux concentrators have no fixed size or dimensions, but neither one can extend beyond the centerline of the Hall cell circuit.

Figure 5:
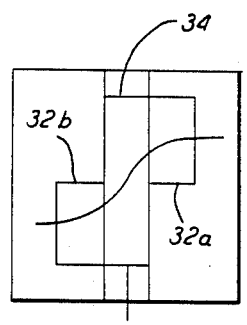
FIG. 5 is a top plan view of the non-oriented gear sensor showing the concentration of flux lines through the sensor when the sensor has a conventional orientation to a gear tooth as in FIG. 1.
Figure 6:
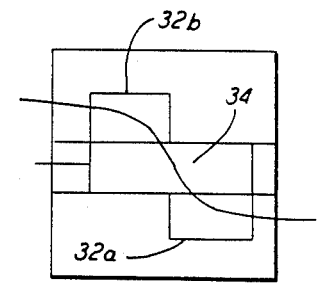
FIG. 6 is a top plan view of the non-oriented gear sensor showing the concentration of flux lines through the sensor when the sensor is rotated 90° from the conventional orientation of FIG. 1.

In the oriented embodiment, the flux concentrators have no fixed height relative to the Hall cell integrated circuit package above the planar surface of one polar end of the magnet. In the non-oriented embodiment, it is advantageous that the height of the flux concentrators 32a, 32b and the Hall cell package be equal, so that their top edges are flush. Such height relationship permits an optimal air gap in many applications. changing the distance between the gear tooth and the edge of the Hall cell within nominal practical limits does not radically effect the Hall cell operation; tolerances are more liberal than with prior art devices. FIG. 5 shows conditions which obtain as a gear tooth passes the Hall cell, when the sensor is oriented conventionally as in FIG. 1, while FIG. 6 shows the sensor rotated 90°. In these figures the direction of B is changed by the presence of the gear tooth such that a component of B is perpendicular to the plane of the Hall cell. As the tooth advances the direction of B reverses the component of B perpendicular to the plane of the Hall cell. An important parameter is the magnitude of the component of the B vector which is perpendicular to the Hall cell. While this magnitude varies continuously as the gear teeth pass the sensor, the frequency is independent of the angular orientation of the sensor and its distance from the teeth.

There are several factors which influence the performance of the sensor. These are the size of the gear teeth including the spacing between them; the closeness of the teeth to the Hall cell which is buried in the Hall cell package; the magnitude of the flux which is available to be modulated by the gear teeth; the sensitivity of the Hall digital latch; the enhancements of flux guides; and the thinness of the Hall cell package. The sensitive plane of the Hall cell must be accessible by flux through the smallest dimension of the package for optimal operation.

The size of the flux guide is proportional to the Hall cell package size which can vary from device to device. It is recognized that the specific dimensions of the concentrators must be optimized in shape and size to obtain maximum performance.

The precise configuration of the magnet whether it be a hexahedral or a cylindrical shape is not relevant to the function of the invention.

The Hall cell is used to sense a ferrous or other magnetic object directly, and not the conventional way by passing a magnet or by interrupting a magnetic field with a vane as used on most of the ignition systems in the auto industry. The invention enables one to concentrate the lines of flux one way and then the other to achieve a flux reversal, and makes it possible to manufacture a very sensitive device with consistency and reliability.

Variations in the placement of the flux concentrators and the Hall cell integrated circuit as well as their angular position on one polar surface of the magnet are possible. Improved packaging for the Hall cell integrated circuit may eliminate the desirability of recessing the package in the magnet.

We claim:

1. A direct coupled gear tooth sensor to sense the presence or absence of gear teeth or similar ferrous objects as they rotate past a sensor, independent of the angular orientation of said sensor to said gear teeth, comprising:
   a single permanent magnet;
   a substantially planar Hall cell integrated circuit package having opposed first and second planar surfaces, said package being positioned adjacent to one polar end of said magnet such that the flux lines from said magnet have essentially no component perpendicular to the plane of said Hall cell in the absence of said teeth;
   means to steer and concentrate the flux lines of said magnet perpendicular to the plane of said Hall cell when said flux lines are modulated by the presence of a ferrous gear tooth or similar ferrous object, said means comprising first and second soft iron flux concentrators appended to said one planar end of said magnet, said concentrators being arranged adjacent respective opposed planar surfaces of said package and off center from each other.

2. The sensor of claim 1 wherein said Hall cell integrated circuit includes a digital switch.

3. The sensor of claim 1 wherein said Hall cell integrated circuit includes a digital latch.

4. The sensor of claim 1 wherein said Hall cell integrated circuit produces an output pulse for each passing gear tooth or similar shape.

5. The sensor of claim 5 wherein said Hall cell is located substantially in the center of said package, said first flux concentrator has one end even with the center line of said Hall cell package, and said second flux concentrator likewise has one end even with the center line of said Hall cell package.

6. The sensor of claims 1 or 5 wherein said flux concentrators are positioned such that when a gear tooth or similar shape is in line with said Hall cell and said flux concentrators, the flux perpendicular to the plane of said Hall cell is essentially zero and as a gear tooth or similar shape is displaced to one side, the flux is steered to produce a component perpendicular to the plane of said Hall cell, causing a complete flux reversal with each passing tooth.

7. The sensor of claims 1 or 5 wherein said flux reversal causes an output pulse to reverse the state of said switch or latch.

8. The sensor of claim 1 or 5 wherein said Hall cell package is partially recessed in said magnet.

9. The sensor of claims 1 or 5 wherein said flux reversal causes an output pulse at speeds down to DC or zero speed.

10. The sensor of claims 1 or 5 wherein said flux concentrators have the same height as said Hall cell integrated circuit.

11. The sensor of claim 1 wherein said Hall cell is located substantially in the center of said package and each of said flux concentrators does not extend beyond the center line of said Hall cell integrated circuit package.

* * * * *